United States Patent [19]

Patalong

[11] Patent Number: 4,612,449
[45] Date of Patent: Sep. 16, 1986

[54] THYRISTOR HAVING A SECONDARY EMITTER ELECTRODE AND A METHOD FOR OPERATING THE SAME

[75] Inventor: Hubert Patalong, Munich, Fed. Rep. of Germany

[73] Assignee: Siemens Aktiengesellschaft, Berlin & Munich, Fed. Rep. of Germany

[21] Appl. No.: 199,520

[22] Filed: Oct. 22, 1980

[30] Foreign Application Priority Data

Nov. 9, 1979 [DE] Fed. Rep. of Germany ....... 2945347

[51] Int. Cl.[4] .................................................. H03K 19/60
[52] U.S. Cl. ................................. 307/252 C; 357/23.4; 357/23.12; 357/38; 357/86
[58] Field of Search .................. 357/20, 38, 23, 86; 307/252 C

[56] References Cited

U.S. PATENT DOCUMENTS

| | | | |
|---|---|---|---|
| 3,360,696 | 12/1967 | Neilson et al. | 357/39 |
| 3,742,318 | 11/1971 | Yamashita | 357/38 |
| 3,753,055 | 8/1973 | Yamashita et al. | 357/38 |
| 3,831,187 | 8/1974 | Neilson | 357/38 |
| 3,858,235 | 12/1974 | Schild | 357/38 |
| 3,896,476 | 7/1975 | Kawakami | 352/38 |
| 4,016,592 | 4/1977 | Yatsuo et al. | 357/38 |
| 4,087,834 | 5/1978 | Temple | 357/38 |
| 4,092,703 | 5/1978 | Sueoka et al. | 357/86 |
| 4,142,201 | 2/1979 | Sittig et al. | 357/38 |
| 4,199,774 | 4/1980 | Plummer | 357/23 |
| 4,219,833 | 8/1980 | Temple | 357/38 |
| 4,224,634 | 9/1980 | Svedberg | 357/38 |
| 4,243,998 | 1/1981 | Schlangenotto et al. | 357/38 |
| 4,244,000 | 1/1981 | Veda et al. | 357/38 |
| 4,301,462 | 11/1981 | Lowry | 357/38 |
| 4,331,884 | 5/1982 | Svedberg | 357/38 |

FOREIGN PATENT DOCUMENTS

| | | | |
|---|---|---|---|
| 2040657 | 2/1972 | Fed. Rep. of Germany | 357/38 |
| 2149760 | 4/1972 | Fed. Rep. of Germany | 357/38 |
| 52-35586 | 3/1977 | Japan | 357/38 |

OTHER PUBLICATIONS

B. Baliga, "Enhanc. and Depc. Vert. Chan. MOS Gated Thyrs.", Electr., Lett., Sep. 27, 1979, vol. 15#20, pp. 645–647.

J. Plummgr et al., "Insulated–Gate Planar Thyristors I & II", IEEE Trans. on Elec. Dev., vol. EP-27#2, Feb. 1980, pp. 380–394.

*Primary Examiner*—Joseph E. Clawson, Jr.
*Attorney, Agent, or Firm*—Hill, Van Santen, Steadman & Simpson

[57] ABSTRACT

A thyristor structure has a semiconductor body which includes first and second base layers adjacent and contacting one another, a p-emitter layer contacting the first base layer, a first electrode contacting the p-emitter layer, an auxiliary, n-emitter layer contacting the second base layer, a second electrode contacting the auxiliary n-emitter layer and bridging the pn junction between the second base layer and the auxiliary n-emitter layer a n-emitter layer contacting the second base layer and a third electrode contacting the n-emitter layer. At least one current path which can be turned off comprises a metal-insulator-semiconductor structure located at the boundary surface of the semiconductor body which carries the second electrode. The MIS semiconductor structure includes first and second semiconductor regions of the first conductivity type spaced apart with a third semiconductor region of an opposite conductivity type intermediate thereto, all regions extending up to the boundary surface of the semiconductor body. An insulated gate covers the third region and has a control voltage terminal. Portions of the second base layer extends through the n-emitter layer and contact the third electrode at the boundary surface. The structure also includes a trigger electrode carried on the base layer which is adjacent the boundary surface. The thyristor is switched from the block state to the conducting state by the application of a control voltage and the control voltage may simultaneously be applied to the trigger electrode.

7 Claims, 3 Drawing Figures

THYRISTOR HAVING A SECONDARY EMITTER ELECTRODE AND A METHOD FOR OPERATING THE SAME

BACKGROUND OF THE INVENTION

1. Field of the Invention

The present invention relates to a thyristor having an auxiliary emitter electrode, in which thyristor there is an outside n-emitter layer having a cathode, an outside p-emitter layer having an anode, two base layers respectively adjacent thereto and contacting one another, and an outside auxiliary emitter zone which is adjacent one of the base layers and is provided with the auxiliary emitter electrode extending on the side facing the n-emitter layer (p-emitter layer) in such a manner that it bridges the pn junction located between the auxiliary emitter zone and a portion of the adjacent base layer, and to a method for operating the thyristor.

2. Description of the Prior Art

Thyristors of the type generally set forth above are known from the book by E. Spenke "PN Junctions" (Volume 5 of the series "Halbleiter-Elektronik"), Springer-Verlag, Berlin 1979, pp. 123-124, particularly FIG. 16.15. Such thyristors are suited for high slew rates of the load current flowing between the anode and the cathode, since the internal trigger amplification assures a very rapid course of the entire trigger operation.

SUMMARY OF THE INVENTION

The object of the present invention is to provide an improved thyristor structure in terms of stability with the most simple possible circuit structure, i.e. to achieve a high degree of security against unintentional trigger operations upon the occurrence of voltages poled in the forward conducting direction at the anode-cathode path without negatively influencing its turn-on behavior.

The above object is realized, in a thyristor of the type generally set forth above, in that at least one current path is provided which can be shut off, the current path being designed as a metal-insulator-semiconductor (MIS) structure arranged at the boundary surface of the semiconductor body carrying the auxiliary emitter electrode, the current path comprising a first semiconductor region of a first conductivity type connected to the adjacent base layer, a second semiconductor region of the first conductivity type connected to the auxiliary emitter electrode, and an intermediate third region of a second conductivity type lying between the first and second regions. The intermediate third region is covered with an insulated gate which is provided with a control voltage terminal. The n-emitter layer (p-emitter layer) is penetrated by at least one zone of the adjacent base layer which extends up to the boundary surface of the semiconductor body and is conductivity connected to the cathode (anode) at the boundary surface.

A thyristor having controllable emitter short circuits designed as MIS structures is known from U.S. Pat. No. 3,243,669. Upon application of the control voltage to the gate of an MIS structure, a short circuit path is activated which bridges the pn junction between the emitter layer connected to the cathode (anode) and the adjacent base layer. This action results in a transfer of the thyristor from the current-conducting state into the blocked state in which, despite an applied voltage in the forward conducting direction, practically no current flows between the cathode and the anode. The switching from the blocked state into the current-conducting state occurs by the application of a further control voltage to the gate of a further MIS structure which bridges a pn junction between two internal semiconductor layers of the thyristor. Operation of the thyristor with two control voltages, however, requires a corresponding circuit expense.

On the other hand, for example, a thyristor is known from the German allowed and published application 24 38 894, in which a short circuit emitter is provided in which an outer emitter zone is penetrated by a plurality of short circuit zones to be interpreted as parts of the adjacent base layer, the short circuit zones extending up to the boundary surface of the thyristor body and being connected to the cathode at the boundary surface. What is disadvantageous with this structure is that many short circuit zones must be provided in order to achieve a good stability of the thyristor. However, with an increasing plurality of short circuit zones, the trigger behavior of the thyristor deteriorates more and more. The triggered surface spreads ever more slowly in the lateral direction over the entire cross-section of the device. Significant turn-on losses arise as a result.

A thyristor constructed in accordance with the present invention is distinguished in that the main emitter is penetrated by short circuit zones which involve less technological expense and only the auxiliary emitter zone is equipped with a controllable short circuit structures which, however, precisely at this location, have a decisive influence on the triggerability of the thyristor, so that rapid trigger operations and low turn-on losses can be achieved.

BRIEF DESCRIPTION OF THE DRAWINGS

Other objects, features and advantages of the invention, will be best understood from the following detailed description, taken in conjunction with the accompanying drawings, on which.

DESCRIPTION OF THE PREFERRED EMBODIMENTS

Figure 1:
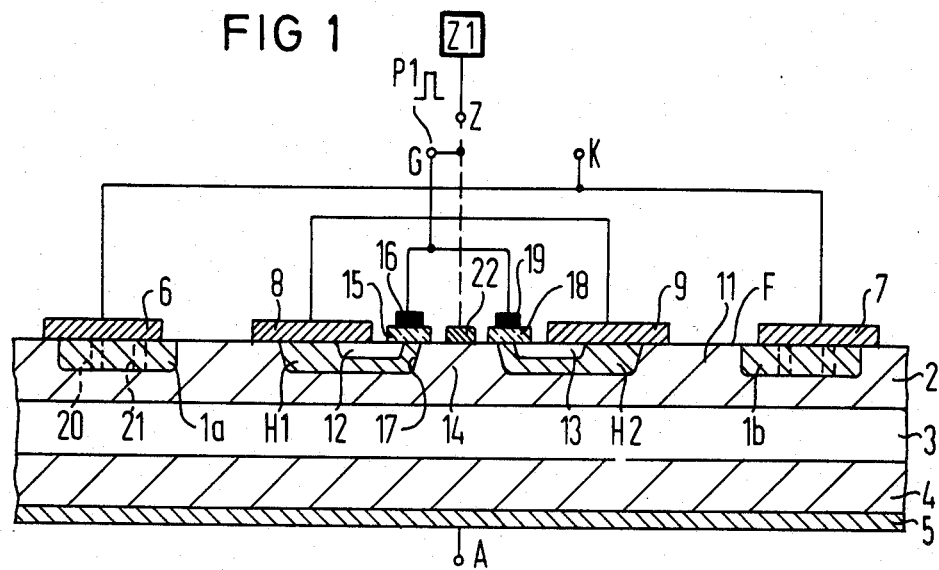
FIG. 1 is a cross-sectional view of a first exemplary embodiment of the invention.
Figure 2:
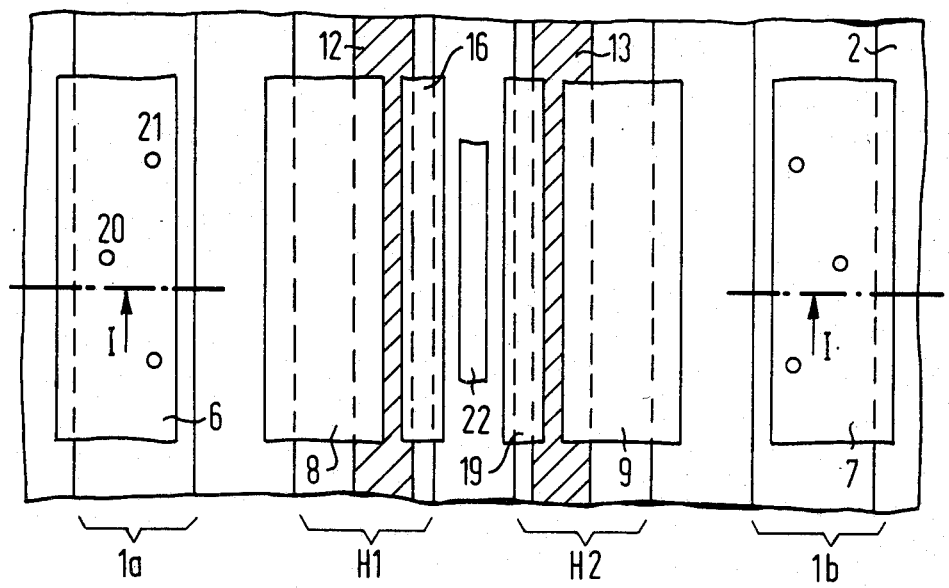
FIG. 2 is a plan view of the arrangement according to FIG. 1.

The thyristor illustrated in FIGS. 1 and 2 has a semiconductor body including semiconductor layers 1-4 of different conductivity types which, for example, consist of doped silicon. The outside n-conductive layer 1 which is subdivided into two partial layers 1a and 1b is designated as an n-emitter layer and the outside p-conductive layer 4 is designated as the p-emitter layer. The p-conductive layer 2 and the n-conductive layer 3 represent the base layers. The p-emitter layer 4 is provided with an anode 5 which has an anode terminal A. The partial layers 1a and 1b of the n-emitter layer can be seen in FIG. 2 as parallel strips extending vertically. Each of the partial layers 1a and 1b is provided with strip-shaped electrodes 6 and 7, respectively, of a cathode, whereby the electrodes 6, 7 are conductively connected to another and connected to a common cathode terminal K.

In FIG. 1, which shows a cross-sectional view taken along the line I—I of FIG. 2, an outside n-conductive auxiliary emitter zone is illustrated which consists of the partial zones H1 and H2. The latter are respectively provided with an electrode 8 and an electrode 9, respectively, of an auxiliary emitter electrode, the electrodes 8 and 9 being conductively connected to one another. The electrodes 8 and 9 extend on those sides facing the n-emitter partial layers 1a and 1b in such a manner that they bridge the pn junctions located between the auxiliary emitter partial zones and those portions of the base layer 2 referenced 10 and 11. P-conductive semiconductor regions 12 and 13 are located in the auxiliary emitter partial zones H1 and H2 in such a manner that they extend up to the boundary surface F of the semiconductor body. In FIG. 2, the surfaces of the semiconductor regions are hatched for the purpose of greater clarity. The regions 12 and 13 are respectively contacted at their edges by portions of the electrodes 8, 9. A zone 14 of the base layer 2 extends up to the boundary surface F and separates the partial zones H1 and H2 from one another. The zone 14 forms a first p-conductive region; the semiconductor region 12 forms a second p-conductive region and the intervening portion of the partial zone H1 forms an n-intermediate region. A thin, electrically insulating layer 15 consisting, for example, of SiO$_2$, is provided on the boundary surface F, and a gate 16 is arranged on the electrically insulating layer 15 in such a manner that it covers the n-intermediate region. The elements 12, H1, 14, 15 and 16 form a MIS structure. If the structure is of the depletion type, then, without the influence of a voltage at the gate 16, a p-conductive inversion channel 17 exists at the boundary surface F between the regions 12 and 14 and conductively connects these regions to one another. If one applies a positive control voltage to a control terminal G of the gate 16, then the inversion channel 17 is eliminated. If the MIS structure is of the enhancement type, then, given a voltage-free gate 16, no inversion channel 17 exists. The inversion channel is only constructed upon the application of a negative control voltage to the gate G by inversion of the partial zone H1 beneath the gate 16.

The inversion channel 17, therefore, represents a controllable short circuit which optionally connects the base layer 2 to the region 12 and, therefore, to the electrode 8 of the auxiliary emitter electrode as a function of a control voltage supplied to the terminal G, the connection being a low-resistant connection.

An MIS structure 13, H2, 14, 18 and 19 arises in an analogous manner by the arrangement of an electrically insulating layer 18 consisting, for example, of SiO$_2$, on which a gate 19 is provided and likewise connected to the terminal G, in which MIS structure 13, H2, 14, 18 and 19, an emitter short circuit between the regions 13 and 14 and, therefore, between the base layer 2 and the electrode 9 of the auxiliary emitter electrode is either activated or deactivated as the function of a control voltage applied at the terminal G.

The n-emitter partial layer 1a is penetrated by zones 20, 21 of the base layer 2 which extend up to the boundary surface F of the semiconductor body and are respectively conductively connected to the electrode 6 of the cathode at the boundary surface. This structure, therefore, is a matter of non-controllable emitter short circuits. The same are also found in the n-emitter partial layer 1b.

Given MIS structures of the depletion type, the emitter short circuits are respectively effective given a voltage-free terminal G. The thyristor is conditioned in the blocked state in which, despite a voltage poled in the forward conducting direction at the terminals A and K, practically no current flows between these terminals. The thermally generated holes are diverted from the base layer 2 to the electrodes 8 and 9 of the auxiliary emitter electrode, so that no charge carriers are injected from the auxiliary emitter partial zones H1 and H2 into the base layer 2. Therefore, no auxiliary current arises between the p-emitter layer 4 and the auxiliary emitter partial zones which could be conducted across the electrodes 8 and 9 to the n-emitter electrodes 6 and 7 in order to completely trigger the thyristor. There therefore exists a state of low trigger sensitivity or, respectively, high stability. Only when a positive voltage pulse P1 is supplied to the terminal G are the emitter short circuits switched off solely for the duration of the pulse P1, whereby an auxiliary current first arises across the auxiliary emitter partial zones which then triggers the thyristor, so that it is switched into the current-conducting state. Subsequently, a load current of a load circuit connected to the terminals A and K flows across the entire thyristor which is switched to a low-resistance state. The shut-down of the thyristor is achieved by shutting off the voltage applied to the terminals A and K in the forward conducting direction or, in the case of an alternating voltage by the next successive zero crossing. In principle, one of the two MIS structures illustrated in FIG. 1 also suffices for the described switching of the thyristor.

The course of the triggering operation can be further accelerated when the base layer 2 is provided with a trigger electrode. In FIG. 1, a trigger electrode 22 contacts the zone 14. The trigger electrode 22 is provided with a terminal Z for a trigger circuit Z1 which feeds the trigger current into the base layer 2. According to a further development of the invention, the terminal G is connected to the terminal Z as is illustrated with broken lines. In this case, a trigger voltage pulse can be tapped at the terminal Z and employed as a control pulse P1.

Figure 3:
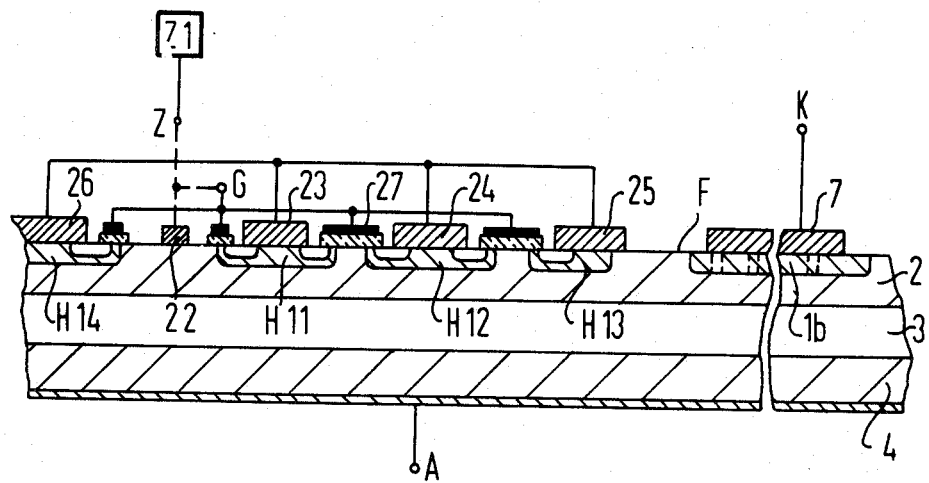
FIG. 3 is a cross-sectional view of a second exemplary embodiment of the invention.

FIG. 3 illustrates a thyristor of the type already described in which a plurality of auxiliary emitter partial zones H11–H14 are provided, which partial zones are provided with electrode portions 23–26 of an auxiliary emitter electrode. Common gates, for example, the gate 27 which are connected to the terminal G, are respectively provided for the control of two neighboring MIS structures. The thyristor is shown with broken lines in the area of the n-emitter partial layer 1b since this area is significantly greater than the semiconductor region exhibiting the auxiliary emitter partial zones. The length of the individual inversion channel 17 is in the range of 2–3 $\mu$m, for example. The elements 23–27, H11–H14, 1b and 7, can be designed, for example, strip-shaped and extend essentially parallel to one another, as do the correspondng elements of FIG. 2. On the other hand, the thyristor of FIG. 3 can also be interpreted as a rotationally-symmetrical body having an axis of symmetry extending through the electrode 22, whereby the structures provided at the surface F are then designed as annular rings.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. In a thyristor structure of the type in which a semiconductor body includes first and second base layers adjacent and contacting one another, a p-emitter layer contacting the first base layer, a first electrode contacting the p-emitter layer, an auxiliary n-emitter layer contacting the second base layer, a second electrode contacting the auxiliary n-emitter layer and bridging the pn junction between the second base layer and the auxiliary n-emitter layer, an n-emitter layer contacting the second base layer and a third electrode contacting the n-emitter layer, the improvement comprising:

at least one current path which can be turned off comprising a metal-insulator-semiconductor structure located at the boundary surface of the semiconductor body which carries the second elecctrode, said metal-insulator-semiconductor structure including first and second semiconductor regions of a first conductivity type spaced apart, said first region connected to the second base layer, said second region connected to the second electrode, a third semiconductor region of an opposite second conductivity type intermediate said first and second regions, an insulated gate covering said third region, a control voltage terminal connected to said gate, and portions of the second base layer extending through the n-emitter layer and contacting the third electrode at the boundary surface.

2. The improved thyristor structure of claim 1, wherein:

the auxiliary n-emitter layer is divided into a plurality of space apart strip-shpaed auxiliary emitter zones each including edges and each being provided with a portion of said second electrode; and comprising a plurality of the metal-insulator-semiconductor structures, each constructed strip-shaped and located at an edge of a respective strip-shaped emitter zone.

3. The improved thyristor structure of claim 1, wherein:

the first semiconductor region is located within the auxiliary n-emitter layer and extends up to the boundary surface of the semiconductor body;

the second semiconductor region is located in and comprises a portion of the second base layer and extends up to the boundary surface; and the third semiconductor region is located in and comprises a portion of the auxiliary n-emitter layer and extends up to the boundary surface.

4. The improved thyristor structure of claim 1, and further comprising:

a trigger electrode carried on said second base layer; and a trigger terminal connected to said trigger electrode.

5. The improved thyristor structure of claim 4, and further comprising:

an electrical connection connecting said trigger electrode and said insulated gate.

6. In a thyristor structure of the type in which a semiconductor body includes first and second base layers adjacent and contacting one another, a p-emitter layer contacting the first base layer, a first electrode contacting the p-emitter layer, an auxiliary n-emitter layer contacting the second base layer, a second electrode contacting the auxiliary n-emitter layer and bridging the pn junction between the second base layer and the auxiliary n-emitter layer, an n-emitter layer contacting the second base layer and a third electrode contacting the n-emitter layer, and in which at least one current path which can be turned off comprises a metal-insulator-semiconductor structure located at the boundary surface of the semiconductor body which carries the second electrode, the metal-insulator-semiconductor structure including first and second semiconductor regions of a first conductivity type spaced apart, the first region connected to the second base layer, the second region connected to the second electrode, a third semiconductor region of an opposite second conductivity type intermediate the first and second regions, an insulated gate covering said third region, a control voltage terminal connected to the gate, portions of the respective base layer extending through the n-emitter layer and contacting the third electrode at the boundary surface, comprising the steps of:

applying a voltage pulse to the insulated gate to cause the thyristor structure to transfer from the blocked state into the conducting state.

7. The method of claim 6, and further defined as: simultaneously applying the voltage pulse to the trigger electrode.

* * * * *